United States Patent [19]
Loeppert

[11] Patent Number: 4,746,898
[45] Date of Patent: May 24, 1988

[54] BI-PHASE DECODER

[75] Inventor: Peter V. Loeppert, Hoffman Estates, Ill.

[73] Assignee: Gould Inc., Rolling Meadows, Ill.

[21] Appl. No.: 920,625

[22] Filed: Oct. 20, 1986

[51] Int. Cl.⁴ .............................................. H03M 5/12
[52] U.S. Cl. .............................. 340/347 DD; 375/110; 340/347 DA
[58] Field of Search .................. 340/347 DA; 375/110

[56] References Cited
U.S. PATENT DOCUMENTS 3,988,729 10/1976 Herman ........................ 340/347 DA
4,450,572 5/1984 Stewart et al. ................. 375/110 X

OTHER PUBLICATIONS

Hewlett-Packard, Optoelectronics/Fiber-Optics Application Manual, Second Edition, pp. 10.13-10.22.

Primary Examiner—William M. Shoop, Jr.
Assistant Examiner—Richard K. Blum
Attorney, Agent, or Firm—Edward E. Sachs; G. Paul Edgell; Robert J. Fox

[57] ABSTRACT

A decoder for recovering data signals and clock signals from an encoded data stream includes: a delay circuit responsive to an encoded data stream for producing a delayed data stream, the delayed data stream being delayed a predetermined period of time from the encoded data stream; a D-type flip-flop responsive to the encoded data stream and to a clock signal for producing a data signal; and a phase comparator responsive to the delayed data stream and to the data signal for producing a clock signal.

1 Claim, 2 Drawing Sheets

BI-PHASE DECODER

BACKGROUND OF THE INVENTION

This invention relates to a technique for recovering data and clock signals from an encoded serial data stream and more particularly relates to a decoder for decoding bi-phase and Manchester coding.

Bi-phase encoding of serial data for transmission over wire or fiber optic lines is commonly used because the code has a 50% duty cycle and is self-clocking. Bi-phase encoding is also known as Manchester, phase encoding, and frequency modulation. There are three versions of bi-phase encoding designated "l", "m" and "s".

The "l" or level version has transitions in the middle of the bit period and uses rising edges for a zero and falling edges for a one. The "m" or mark version has transitions at the beginning of every bit period and also has a transition at the middle of a one bit. The "s" or space version has transitions at the beginning of every bit period and also has a transition at the middle of a zero bit. The "l" version is usually called Manchester encoding.

The standard way of decoding bi-phase data is to use a Phase Locked Loop (PLL) to recover the clock and then to use the clock to recover the original NRZ (non return to zero) bit stream. Although the PLL is capable of operating at 100 megabits per second, the PLL must lock in phase with the clock signal derived from the demodulation, and there is a certain amount of settling time required for the PLL to lock in. Thus the demodulator clocked by a PLL would require a definite period of "training" or preamble during which the transmitted encoded signal contains only reference edges. For bi-phase this period would be a sequence of consecutive zeros to be encoded; for Manchester the sequence would be one, zero, one, zero, etc. In either case the encoded waveform for training is a series of alternately high and low levels with each having a full bit interval duration. For situations requiring transmission of bursty data at very high data rates, a preamble is required at the beginning of each burst and thus limits the data throughput. It is desirable to have a decoder that uses little or no preamble to increase data throughput.

A decoder that uses little or no preamble is described in Hewlett Packard's Opto-Electronics/Fiber Optics Applications Manual, Second Edition, at page 10.16. The Hewlett Packard demodulator does not require long training; it requires only one full bit interval with no edges followed by a reference edge (in bi-phase, a single encoded zero; in Manchester, a one, zero or zero, one). The reason for the rapid training is that a pair of monostable vibrators (one shots) are used. While this decoder requires little or no preamble, the problem with this encoder is that one shots are limited in speed of operation and thus the entire decoder is limited to about 10 to 20 megabits per second.

Therefore it is an object of the present invention to provide a bi-phase decoder that can decode bursty type data without lengthy preamble.

It is another object of the present invention to provide a bi-phase decoder which can decode data at the rate of 100 megabits per second or greater.

Additional objects, advantages and novel features of the invention will be set forth in part in the description which follows and in part will become apparent to those skilled in the art upon examination of the following or may be learned by practice of the invention.

SUMMARY OF THE INVENTION

To achieve the foregoing and additional objects and in accordance with the purposes of the present invention, a decoder for recovering data signals and clock signals from an encoded data stream may comprise: a delay circuit responsive to an encoded data stream for producing a delayed data stream, and delayed data stream being delayed a predetermined period of time from the encoded data stream; a control means responsive to the encoded data stream and to a clock signal to provide a data signal; and a phase comparator responsive to the delayed data stream and to the data signal to provide a clock signal.

BRIEF DESCRIPTION OF THE DRAWINGS

The present invention is illustrated in the accompanying drawings wherein.

DESCRIPTION OF PREFERRED EMBODIMENTS

Figure 1:
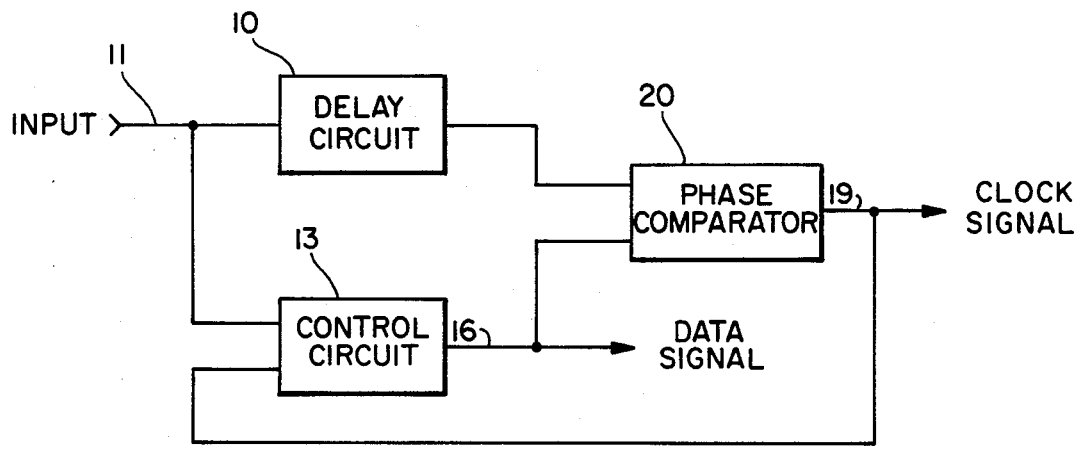
FIG. 1 is a schematic of a decoder according to the present invention.

Referring to FIG. 1, an encoded data stream 11 is applied simultaneously to the input of delay circuit 10 and one of the inputs of control circuit 13. Delay circuit 10 delays the encoded data stream by a predetermined amount and generates a delayed data stream which is applied to one input of phase comparator 20. Phase comparator 20 compares a data signal 16, which was generated by control circuit 13, with the delayed data stream and generates clock signal 19. Clock signal 19 is fed back into the control circuit and used to generate data signal 16.

Figure 2:
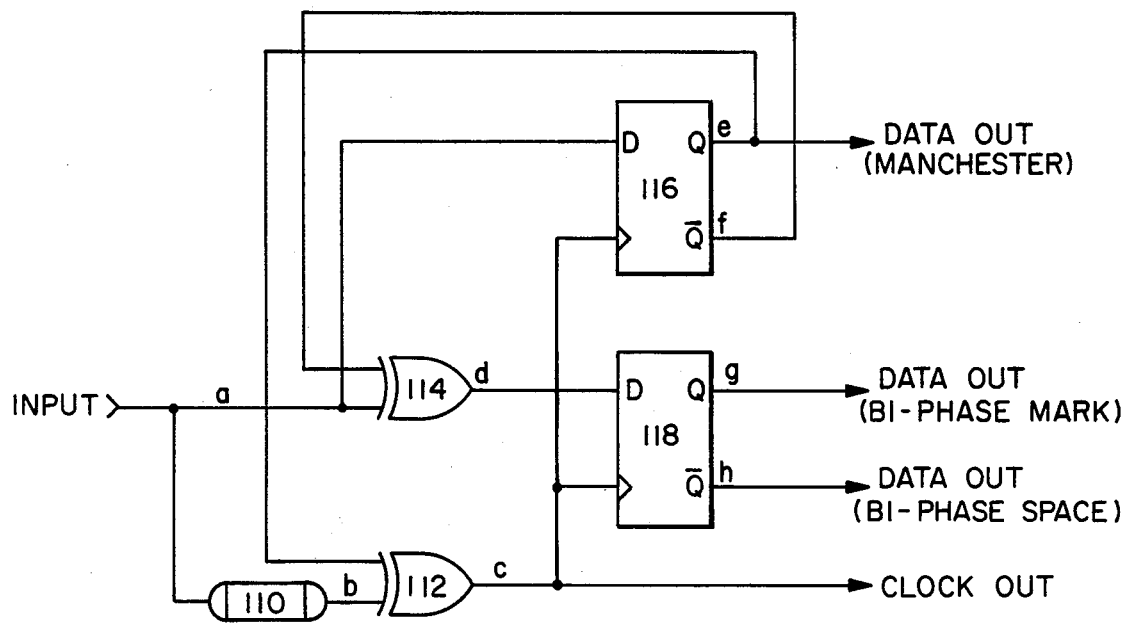
FIG. 2 is a schematic of a decoder according to the present invention which decodes bi-phase and Manchester data.
Figure 3:
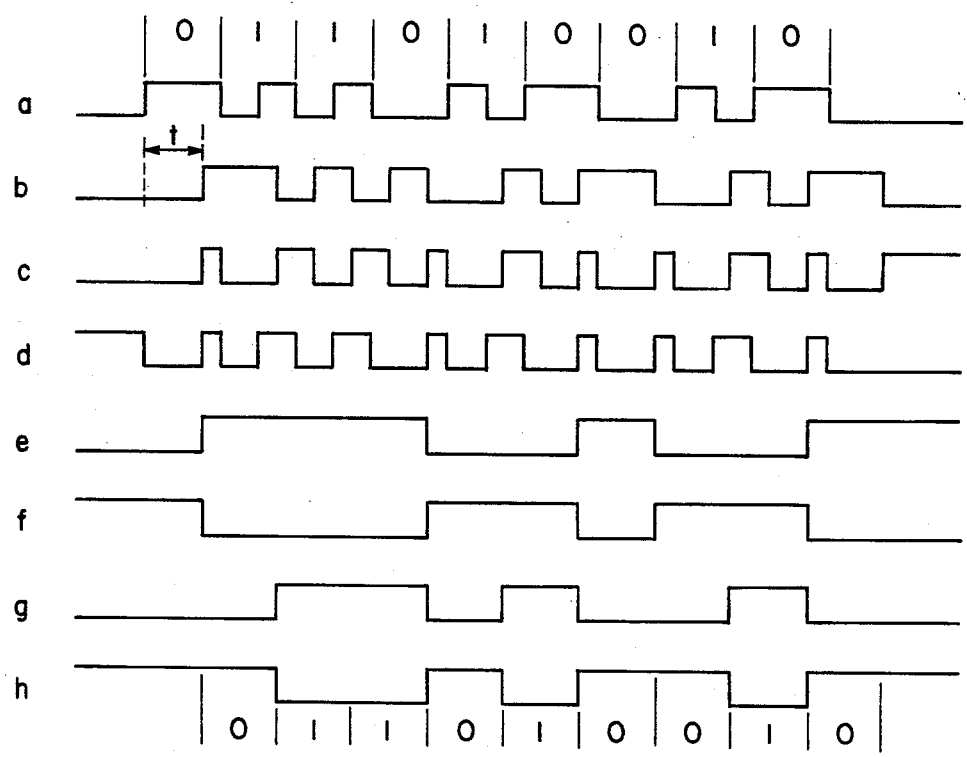
FIGS. 3a–3h are timing charts for the signals indicated on FIG. 2.

Another embodiment of the present invention is shown in FIG. 2. In the embodiment of FIG. 2, D-type flip-flops and exclusive or gates are used. Referring to FIGS. 2 and 3, an encoded data stream represented by "a" is applied to delay line 110 which provides a delayed data stream "b". In this embodiment delay line 110 delays signal "a" a fixed period of time "t" before applying it to exclusive or gate 112. The encoded data stream "a" is also applied to the "D" input or D-type flip-flop 116. Exclusive or gate 112 generates clock signal "c" which is applied to the clock input of D-type flip-flop 116. Output "e" of flip-flop 116 is applied to the other input of exclusive or gate 112. When signal "e" is low signal "c" is equal to signal "b". When "e" is high "c" is equal to the complement of "b". Signal "e" only changes on the rising edge of "c" and its value takes on the value of "a" at that instant. Signal "e" also represents the decoded Manchester data output.

In order to decode data that has been encoded in bi-phase mark or space, additional elements 114 and 118 are provided. Encoded data stream "a" is applied to exclusive or gate 114 which generates intermediate output "d". The inverse output signal "f" from flip-flop 116 is also applied to exclusive or gate 114. When "f" is low, "d" is equal to "a"; when "f" is high, "d" is equal to the complement of "a". D-type flip-flop 118 generates the bi-phase mark data output "g" when intermediate signal "d" is applied to the "D" input of D-type flip-flop 118 and clock signal "c" is applied to the clock input of D-type flip-flop 118. "g" only changes on the rising edge of "c" and takes on the value of "d" at that instant. Bi-phase space data can be recovered at output "$\bar{Q}$" of D-type flip-flop 118.

Delay line 110 can be formed by using any suitable distributed or lumped delay element. For bi-phase encoded data, the ideal sample point is $\frac{3}{4}$ of a bit period from the reference edge, so in this particular embodiment, the delay line has been preferably choosen to shift the input signal $\frac{3}{4}$ of a bit period. Signal "c" therefore has a rising edge at the ideal sampling point. Data is recovered from the data stream by comparing the polarities of the signal at the reference edge and the sample point. For example, in the case of a zero encoded by bi-phase mark, the polarity of the data at the sample point is the same as at the beginning of the bit. In other words, the rising edge sampling a high or a falling edge sampling a low indicates a zero. A one has a transition in it so a rising edge sampling a low or a falling edge sampling a high indicates a one. The key is to keep track of the reference edge, which in the embodiment of FIG. 2 is accomplished by D-type flip-flop 116.

Short clock pulses are generated for half the data sequences where edges are added by flip-flop 116. In the case of bi-phase mark encoding, the clock out signal has short pulses wherever there is a zero. These can be fixed by adding an additional delay line in the signal line "e" from 116 to 112. The delay should be chosen to yield a 50% duty cycle on the clock signals. The speed of this circuit is only limited by the speed of the flip-flop and exclusive or gates and thus is usuable to gigahertz rates.

The decoding technique described here can be extended to any self-clocked encoding scheme which is defined as having at least one transition per bit period. Examples include Miller encoding, modified Miller encoding, and other pulse width modulation (PWM) or pulse code modulation (PCM) codes.

Figure 4:
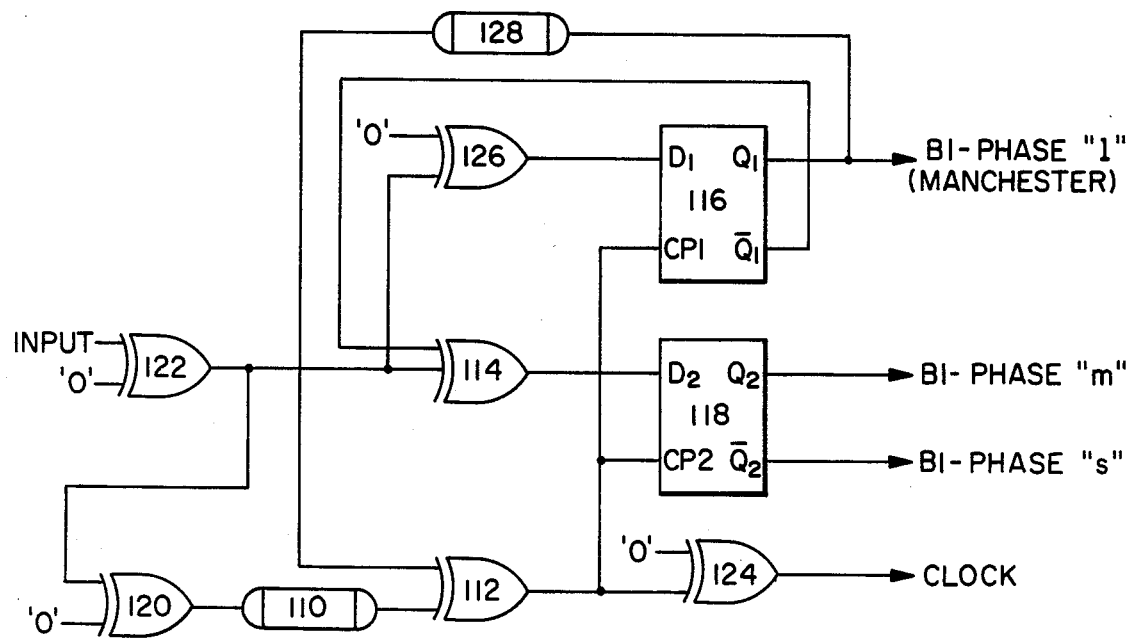
FIG. 4 is a schematic representation of an alternative decoder according to the present invention.

The circuit of FIG. 2 has been modified in FIG. 4 to accomplish these additional features. Like elements are shown with like numbers. Referring to FIG. 4, additional exclusive or gates 120, 122 and 124 have been provided for buffering purposes and have been arbitrarily choosen to be exclusive or gates but any other type gate for buffering purposes may be used. Exclusive or gate 126 has been added between the input signal to the "D" input of flip-flop 116 to match the delay of exclusive or gate 114. Preferably, 126 and 114 are identical exclusive or gates. Delay line 128 has been added between the "Q" output of flip-flop 116 and 112 to produce a 50% duty cycle clock. The circuit as shown in FIG. 4 has been built and operated to provide data throughput at the rate of 100 megabits per second. In this embodiment, exclusive or gates were chosen to be Motorola model MC10H107 and the D-type flip-flops were chosen to be Motorola model MC10H131. Delay line 110 was chosen to be a section of transmission line approximately 4 feet in length and delay line 128 was chosen to be a section of transmission line approximately 1 foot in length.

What is claimed is:

1. A bi-phase decoder for receiving a data stream signal encoded in a bi-phase level, mark or space format and producing a level data signal, a mark data signal, a space data signal and a clock signal, comprising:

input means for receiving a data stream signal;

delay means connected to said input means for delaying said data stream signal;

a level signal feedback loop;

a first exclusive OR gate connected to said delay means for receiving said delayed data stream signal and connected to said level signal feedback loop, said first exclusive OR gate producing a clock signal;

a first D-type flip-flop having a data signal input terminal, a clock signal input terminal, a level signal output terminal and an inverted level signal output terminal, said first D-type flip-flop receiving said data stream signal at said data signal input terminal and said clock signal at said clock signal input terminal and producing a level signal at said level signal output terminal and an inverted level signal at said inverted level signal output terminal, said level signal output terminal being connected to said level signal feedback loop and supplying said level signal thereto;

an inverted level signal feedback loop coupled to said inverted level signal output terminal of said first D-type flip-flop, and receiving said inverted level signal therefrom;

a data exclusive OR gate connected to said input means to receive said data stream signal therefrom and to said inverted level signal feedback loop to receive said inverted level signal therefrom, said data exclusive OR gate producing a data OR gate signal in response to said data stream signal and said inverted level signal; and a second D-type flip-flop having a data input terminal, a clock signal input terminal, a mark signal output terminal and a space signal output terminal, said data signal input terminal being connected to said data exclusive OR gate and receiving said data OR gate signal therefrom and said clock signal input terminal being connected to said first exclusive OR gate and receiving said clock signal therefrom, said second D-type flip-flop producing a bi-phase mark signal at said mark signal output terminal and a bi-phase space signal at said space signal output terminal in response to said inverted level signal and said clock signal.

* * * * *